United States Patent Office 3,390,020

Patented June 25, 1968

3,390,020
SEMICONDUCTOR MATERIAL AND METHOD OF MAKING SAME

Joseph Mandelkorn, 3654 Grosvenor, Cleveland Heights, Ohio 44118

No Drawing. Continuation of application Ser. No. 352,692, Mar. 17, 1964. This application Aug. 11, 1967, Ser. No. 660,571
2 Claims. (Cl. 148—1.5)

ABSTRACT OF THE DISCLOSURE

Improving the properties and increasing the resistance to radiation damage of silicon semiconductor material by the selective addition of certain elements or compounds of the elements of Group III of the Periodic Table. The presence of aluminum atoms results in the formation of less recombination centers while the presence of indium atoms results in the formation of less trapping centers than the presence of atoms of other electrically active impurity elements in equal concentration.

This application is a continuation of application Ser. No. 352,692 which was filed Mar. 17, 1964 and is now abandoned.

The invention described herein may be manufactured and used by or for the Government of the United States of America for governmental purposes without the payment of any royalties thereon or therefor.

The present invention relates to a semiconductor material having improved properties and greater resistance to radiation damage. More particularly, the invention is concerned with an improved silicon material for semiconductor devices having a small quantity of certain elements or compounds of the elements in Group III of the Periodic Table in the silicon.

The power output of a silicon solar cell exhibits considerable degradation when it is subjected to high energy atomic particle bombardment, and this effect is detrimental to the useful life of space vehicles which utilize such semiconductor devices as sources of power. This radiation damage results from an undesirable loss in the lifetime of minority carriers within the silicon material from which the solar cells are made.

The power output and the amplification of transistors as well as the rectification efficiency and the high frequency characteristics of diodes are adversely affected by increases in the parasitic resistances of the devices caused by carrier removal radiation damage.

It has been ascertained that minority carrier lifetime in bombarded silicon is affected by the impurities which have been added to obtain the desired resistivity. More particularly, for a particular bombardment dose the value of minority carrier lifetime in silicon material containing a small quantity of certain preferred Group III elements or compounds of Group III elements is higher than that in silicon containing certain other impurities including less desirable Group III elements. Moreover, it has been ascertained that majority carrier removal in bombarded silicon is also affected by the impurities which have been added to obtain the desired resistivity. For a particular bombardment dose the majority carrier removal rate in silicon material containing a small quantity of certain preferred Group III elements or compounds of Group III elements is less than that in silicon containing certain other impurities, including less desirable Group III elements.

It is, therefore, an object of the present invention to provide a "p" type material having improved characteristics for making a semiconductor device.

Another object of the invention is to provide an improved silicon solar cell material containing controlled amounts of certain preferred Group III elements which results in slower degradation of the power output of the cell when subjected to high energy atomic particle bombardment.

A further object of the invention is to provide a silicon semiconductor material containing atoms of certain Group III elements, such as aluminum, to lower the resistivity, the presence of these atoms resulting in the formation of less recombination centers than the presence of atoms of other electrically active impurity elements in equal concentration.

A still further object of the invention is to provide a silicon semiconductor material containing atoms of certain Group III elements, such as indium, to lower the resistivity, the presence of these atoms resulting in the formation of less trapping centers than the presence of atoms of other electrically active impurity elements in equal concentration.

Other objects and advantages of the invention will be apparent from the specification which follows.

Certain electrically active impurities are normally added in controlled quantities to materials, such as silicon, that are to be used in semiconductor devices in order to lower the resistivity to a desired value. The electrical properties of the silicon are altered in this manner because such impurities ionize in the silicon and each ionized impurity atom contributes one mobile charge, called a majority carrier, to the material.

Other mobile charges, called minority carriers, result from the breaking of covalent bonds between silicon atoms. The operation of many semiconductor devices, such as transistors, diodes and solar cells, depends upon the currents arising from the movement of these minority carriers. Therefore, the mobility and lifetime of minority carriers in semiconductor materials are extremely significant in determining device performance. However, the presence of the large quantities of majority carriers in silicon required to reduce the resistivity of the material to a desirable value decreases the mobility and lifetime of the minority carriers in the material. A further decrease in the lifetime of minority carriers occurs when the material is bombarded with high energy atomic particles, such as 1 mev. electrons or 10 mev. protons.

The theory for the limited lifetime of minority carriers, of the order of microseconds, in semiconductor material postulates the existence of configurations of atoms within the material which act to attract and combine minority and majority carriers, which are always of opposite electrical sign. Such configurations are referred to as recombination centers, and these centers expedite the neutralization of minority carriers thereby decreasing the lifetime of the minority carriers.

The increase in resistivity of material which occurs when the material is bombarded is attributed to configurations of atoms in the material called trapping centers which attract and then immobilize majority carriers for a period of time. This effectively increases the resistivity because, at any given moment, a quantity of majority carriers are immobilized. The quantity of immobilized carriers at any instant depends upon the density of the trapping centers. The mechanisms whereby bombardment increases the density of recombination centers thereby decreasing minority carrier lifetime and increases the density of trapping centers thereby increasing resistivity were previously presumed to be attributable to vacancies created in the lattice by bombardment which form recombination or trapping center configurations.

It was also previously believed that the concentration of the electrically active impurities in the semiconductor material was related to the lifetime of minority carriers because each impurity atom contributed a majority carrier, and the greater the number of majority carriers, the greater the probability of a minority carrier combining with a majority carrier. The relationship between concentrations of these impurity atoms and minority carrier lifetime is based on considerations of the statistical probability of a minority carrier recombining with a majority carrier through the media of a fixed density of recombination centers.

The present invention is based on the discovery that the atoms of various electrically active impurity elements themselves affect the formation of recombination centers in the semiconductor material. It has also been discovered that certain of these impurity elements are more desirable than others because the presence of atoms of the desirable impurity results in the formation of either less recombination centers or less trapping centers than the presence of atoms of other electrically active impurity elements in equal concentration.

According to the present invention, small amounts of an element or compound selected from Group III of the Periodic Table are added to a semiconductor material to reduce its resistivity and to preserve good material properties. By way of example, certain elements from Group III of the Periodic Table including aluminum and indium are added to silicon. Solar cells made from the resulting materials are superior to those made from silicon doped with an equal concentration of boron or gallium insofar as the formation of either recombination centers or trapping centers is concerned. Boron is an electrically active impurity from Group III of the Periodic Table which has been added to silicon in the past to reduce the resistivity.

To illustrate the beneficial technical effect of the present invention, groups of solar cells were fabricated from several impurity-doped silicon ingots each having an impurity concentration sufficient to produce a resistivity in the ten to twenty ohm-centimeter range. One group of cells was fabricated from an ingot of boron-doped silicon grown from a melt in a quartz crucible, and these cells are identified as C–B in the Table 1 below.

Another group of cells was similarly fabricated from an aluminum-doped ingot, and the cells made from this ingot are identified as C–Al. The aluminum can be added to silicon by direct addition of pure aluminum to silicon in a crucible or by zone melting the pure aluminum into the silicon. The addition of this element can also be accomplished by adding aluminum compounds in the manner described or by the preparation of a master alloy of silicon and aluminum which is added to the silicon.

Still another group of cells was similarly fabricated from a gallium-doped ingot, and the cells made from this ingot are identified as C–Ga. The gallium was added to the silicon in a manner similar to that used to add the other impurities cited.

All three groups of cells were subjected simultaneously to a series of 1-mev. electron bombardments as illustrated in Table 1. The diffusion length (L) in microns was measured for each cell after each bombardment, and the curve power factor (CPF) as a percent was measured for each cell after the last bombardment. Table 1 presents average characteristics for the three groups of cells after these bombardments. Because the cells within each group had uniform characteristics after bombardment, a valid differentiation in terms of average diffusion length preserved was possible.

TABLE 1

| Cell Group | Number of samples | Dose (e/cm.$^2$) | | | |
|---|---|---|---|---|---|
| | | $1.2\times10^{15}$ | $1.5\times10^{16}$ | $4.1\times10^{16}$ | |
| | | L | L | L | CPF |
| C–Al | 6 | 45 | 18 | 14 | 38 |
| C–B | 10 | 35 | 13 | 10 | 65 |
| C–Ga | 3 | 35 | 12.5 | 9 | 65 |

The diffusion length (L) in both Tables 1 and 2 is defined by the equation $L\sqrt{D\times\tau}$, where D is the diffusion constant and $\tau$ is the minority carrier lifetime. Therefore, the diffusion length is directly proportional to the minority carrier lifetime and a longer diffusion length after bombardment indicates a larger preserved value of minority carrier lifetime in the material.

The curve power factor (CPF) is defined as the ratio, expressed in percent, of the maximum power output of the cell to the product of its open-circuit voltage and short-circuit current. The changes in curve power factor listed in Table 1 occur because of increases in the bulk series parasitic resistance of the solar cells caused by majority carrier removal under bombardment. A lower curve power factor value is therefore indicative of a greater carrier removal.

It is evident from Table 1 that the properties of aluminum in silicon are superior to those of either boron or gallium in silicon insofar as the influence of such properties on the formation of recombination centers is concerned. Table 1 shows that the aluminum-doped cells preserve greater values of diffusion length after each bombardment than either the boron-doped or gallium-doped cells. The boron- and gallium-doped cells preserve approximately equivalent diffusion lengths after each bombardment. The values of curve power factor listed in Table 1 indicate that the majority carrier removal rate is greatest in the aluminum-doped cells, and it is equivalent for the boron- and gallium-doped cells.

Other groups of solar cells were fabricated from silicon ingots having an impurity concentration adequate to produce a desired resistivity either in the ten to twenty ohm-centimeter range or about 100 ohm-centimeters. One group of cells was fabricated from an ingot of boron-doped silicon grown from a melt in a quartz crucible, and sufficient boron was added to the melt to obtain a resistivity in the ten to twenty ohm-centimeter range. These cells are identified as 10–20 ohm-cm. C–B in Table 2 below. Gallium-doped cells having resistivity in the ten to twenty ohm-centimeter range were produced in a like manner, and these cells are identified as 10–20 ohm-cm. C–Ga.

Another group of cells was similarly fabricated from an aluminum-doped ingot having sufficient aluminum added by the previously described method to obtain a resistivity in the ten to twenty ohm-centimeter range. These cells are identified as 10–20 ohm-cm. C–Al in Table 2 below. A fourth group of cells having a resistivity in the ten to twenty ohm-centimeter range was fabricated from an indium-doped ingot, and these cells are identified as 10–20 ohm-cm. C–In.

Two groups of cells having a 100 ohm-centimeter resistivity are likewise shown in Table 2 below. The first group of cells in this resistivity range was fabricated from a boron-doped ingot and is identified as 100 ohm-cm. C–B. The other group was fabricated from indium-doped ingot and is identified as 100 ohm-cm. C–In.

All the five groups of cells were subjected simultaneously to several 10-mev. proton bombardments as illustrated in Table 2. The diffusion length (L) as well as the curve power factor (CPF) were measured for the cells indicated, and Table 2 presents average characteristics of the six groups of cells after these bombardments. Because the cells within each group had uniform characteristics after bombardment, valid differentiation in terms of average diffusion length preserved was possible.

TABLE 2

| Cell Group | Number of samples | Dose (protons/cm.$^2$) | | | | |
|---|---|---|---|---|---|---|
| | | $4\times10^{11}$ | $9\times10^{11}$ | | $1.2\times10^{13}$ | |
| | | L | L | CPF | L | CPF |
| 10–20 ohm-cm. C–Al | 5 | 40 | 37 | ------ | 12 | 68 |
| 10–20 ohm-cm. C–B | 6 | 36 | 32 | ------ | 10 | 70 |
| 10–20 ohm-cm. C–Ga | 5 | ---------- | 32 | ------ | 9.5 | 70 |
| 10–20 ohm-cm. C–In | 5 | 31 | ------ | ------ | ------ | ------ |
| 100 ohm-cm. C–B | 3 | ---------- | 80 | [1] 38 | ------ | <10 |
| 100 ohm-cm. C–In | 3 | ---------- | 65 | [1] 58 | ------ | 50 |

[1] Percent.

It is evident from Table 2 that the aluminum-doped cells preserve longer values of lifetime after each bombardment than do either the boron-, gallium-, or indium-doped cells. Also the boron- and gallium-doped cells preserve greater values of lifetime than do the indium-doped cells. The boron- and gallium-doped cells preserve approximately equivalent values of lifetime after bombardment.

The values of curve power factor listed in Table 2 show that carrier removal in the various ten to twenty ohm-centimeter cell groups is greatest for the aluminum-doped cells. A comparison of the curve power factors of the 100 ohm-centimeter cell groups shows that the carrier removal in the indium-doped cells is less than that in boron-doped cells. It follows that the indium-doped cells are also superior to the aluminum- and gallium-doped cells in terms of carrier removal.

Table 2 also shows that for any particular impurity in silicon the smaller the concentration of the impurity the greater is the diffusion length preserved after any bombardment. The concentration of the impurity in the bulk silicon of the 100 ohm-centimeter cells is approximately one tenth that in the bulk silicon of the ten to twenty ohm-centimeter cells. Corresponding, Table 2 shows that the diffusion length preserved in the 100 ohm-centimeter cells is greater than that in the ten to twenty ohm-centimeter cells. This result holds true under electron, proton and neutron bombardment. Bombardments of cells made from silicon containing various concentrations of boron in the range from $10^{14}$ to $10^{16}$ atoms of boron per cubic centimeter of silicon clearly show that the less the concentration of the impurity the greater is the diffusion length preserved after bombardment.

The data from Tables 1 and 2 can be used to arrange the Group III elements cited in order of decreasing desirability of adding the element to silicon to reduce the resistivity of the material. This is shown below in Table 3.

TABLE 3

Type of radiation damage which is to be minimized

| Carrier Removal | Lifetime Degradation |
|---|---|
| Indium | Aluminum |
| {Gallium | {Gallium |
| {Boron | {Boron |
| Aluminum | Indium |

Indium is the most desirable of the above listed elements to be added to silicon when it is most important to minimize the carrier removal rate in the silicon. This situation occurs in the case of transistors, diodes and other devices which are intended for operation in radiation environments in which high fluxes of atomic particles exist.

Aluminum is the most desirable of the listed elements to be added to silicon when it is most important to minimize lifetime degradation in the silicon. This situation occurs in the case of solar cells and other semiconductor devices intended for use in space when the radiation environments may contain comparatively smaller fluxes of atomic particles. There is little difference between gallium and boron, and both of these elements are not as desirable to use as aluminum or indium.

Since there are lattices defects in semiconductor materials before bombardment, it is found that the impurities added to reduce the resistivity of the material create recombination centers and trapping centers in the material or device in the same manner that they do under bombardment. The various impurities can therefore be listed in accordance with desirability of their use in silicon to obtain lower resistivity and minimum density of either recombination centers or trapping centers. The list is identical to that of Table 3.

The addition of aluminum to silicon results in a lower density of recombination centers being formed in the material than the addition of equal concentrations of other Group III elements listed in Table 3. Minority carrier lifetime in aluminum containing materials is therefore higher.

A further benefit is achieved in that when a p-n junction is created in aluminum-doped silicon, the characteristics of the junction are better than when a p-n junction is created by an identical process in silicon containing any other of the Group III elements listed in equal concentrations.

The addition of indium to silicon results in a lower density of trapping centers being formed in the material than the addition of an equal concentration of other of the Group III elements listed. This advantage is also seen in the electrical characteristics made from indium containing material in that higher open-circuit voltages are obtained for solar cells made from such material than from cells made from material containing equal concentrations of the other Group III elements.

Various examples of semiconductors having improved radiation damage resistance have been described along with several methods of making these semiconductors, it will be appreciated that various modifications can be made to the disclosed material and method without departing from the spirit of the invention of the scope of the subjoined claims.

I claim:

1. A method of improving the resistance to radiation damage of a semiconductor material when used as a solar cell subject to proton bombardments of approximately 10-mev. intensity of the type having a "P" type impurity from the elements of Group III of the Periodic Table added to silicon to lower the resistivity thereof to a predetermined value, said method comprising
   selecting indium from the Group III elements, and
   adding only the indium to the silicon in a concentration of less than about $10^{15}$ atoms per cubic centimeter thereby reducing the formation of trapping centers whereby the carrier removal rate under bombardment is minimized.

2. A method of improving the resistance to radiation damage of a semiconductor material when used as a solar cell subject to electron bombardments of approximately 1-mev. intensity of the type having a "P" type impurity from the elements of Group III of the Periodic Table added to silicon to lower the resistivity thereof to a predetermined value, said method comprising
   selecting aluminum from the Group III elements, and
   adding only the aluminum to the silicon in a concentration of less than about $10^{15}$ atoms per cubic centimeter thereby reducing the number of bombardment introduced recombination centers whereby longer minority carrier lifetime under bombardment is preserved.

(References on following page)

References Cited

UNITED STATES PATENTS

| | | | |
|---|---|---|---|
| 3,198,999 | 8/1965 | Baker | 148—177 XR |
| 3,143,444 | 8/1964 | Lowe | 148—189 XR |
| 2,904,512 | 9/1959 | Horn | 148—16 |
| 3,184,347 | 9/1965 | Hoerni | 148—189 X |
| 2,964,689 | 12/1960 | Buschert | 148—186 X |
| 3,143,444 | 9/1964 | Lowe | 148—189 X |

OTHER REFERENCES

Semiconductor Abstract by Batelle Memorial Institute, 1957, copy in Group 110, pages 100 and 101.

HYLAND BIZOT, *Primary Examiner.*

UNITED STATES PATENT OFFICE

CERTIFICATE OF CORRECTION

Patent No. 3,390,020

June 25, 1968

Joseph Mandelkorn

It is certified that error appears in the above identified patent and that said Letters Patent are hereby corrected as shown below:

In the heading to the printed specification, lines 4 and 5, "Joseph Mandelkorn, 3654 Grosvenor, Cleveland Heights, Ohio 44118" should read -- Joseph Mandelkorn, Cleveland Heights, Ohio, assignor to the United States of America as represented by the Administrator of the National Aeronautics and Space Administration --.

Signed and sealed this 25th day of November 1969.

(SEAL)

Attest:

Edward M. Fletcher, Jr.

Attesting Officer

WILLIAM E. SCHUYLER, JR.

Commissioner of Patents